(12) United States Patent
Tico et al.

(10) Patent No.: US 10,514,717 B2
(45) Date of Patent: Dec. 24, 2019

(54) COMPENSATION CIRCUIT

(71) Applicant: NXP USA, Inc., Austin, TX (US)

(72) Inventors: Olivier Tico, St Lys (FR); Pascal Kamel Abouda, Saint Lys (FR); Yuan Gao, Cugnaux (FR)

(73) Assignee: NXP USA, Inc., Austin, TX (US)

( * ) Notice: Subject to any disclaimer, the term of this patent is extended or adjusted under 35 U.S.C. 154(b) by 5 days.

(21) Appl. No.: 15/407,344

(22) Filed: Jan. 17, 2017

(65) Prior Publication Data

US 2017/0336823 A1 Nov. 23, 2017

(30) Foreign Application Priority Data

May 19, 2016 (EP) ..................................... 16305577

(51) Int. Cl.
| | |
|---|---|
| *G05F 5/00* | (2006.01) |
| *G05F 3/18* | (2006.01) |
| *G05F 3/26* | (2006.01) |
| *H03K 5/125* | (2006.01) |
| *H02M 3/156* | (2006.01) |
| *H03K 5/02* | (2006.01) |
| *H03K 5/24* | (2006.01) |

(52) U.S. Cl.
CPC ................ *G05F 5/00* (2013.01); *G05F 3/185* (2013.01); *G05F 3/262* (2013.01); *H03K 5/023* (2013.01); *H03K 5/125* (2013.01); *H03K 5/2472* (2013.01); *H02M 3/156* (2013.01); *H02M 2003/1566* (2013.01)

(58) Field of Classification Search
CPC ..... G05F 5/00; G05F 3/08; G05F 3/10; G05F 3/12; G05F 3/16; G05F 3/18; G05F 3/185; G05F 3/262; H03K 5/023; H03K 5/125; H03K 5/1252; H03K 5/1254; H03K 5/2472; H03K 5/2481; H03K 5/249; H02M 3/156; H02M 3/1563
USPC ........................................................ 327/306
See application file for complete search history.

(56) References Cited

U.S. PATENT DOCUMENTS

| | | | |
|---|---|---|---|
| 3,031,608 A | 4/1962 | Eschen et al. | |
| 5,255,146 A | 10/1993 | Miller | |

(Continued)

FOREIGN PATENT DOCUMENTS

| | | |
|---|---|---|
| CN | 103399607 A | 11/2013 |
| CN | 104503531 A | 4/2015 |

(Continued)

*Primary Examiner* — Patrick C Chen

(57) ABSTRACT

A compensation circuit configured for coupling to a voltage source and a reference circuit. The voltage source is configured for supplying a supply voltage to the compensation circuit and the reference circuit. The reference circuit includes a first circuit node and a reference output electrically coupled to the first circuit node for outputting a reference signal having a constant reference amplitude. The compensation circuit includes a transient converter for converting a first transient perturbation of the supply voltage into a first compensation electrical signal proportional to said first transient perturbation, and an adder coupled to the transient converter for adding the first compensation electrical signal to an electrical signal at the first circuit node with a first polarity opposite to a disturbance polarity of a disturbance of the electrical signal in response to the first transient perturbation.

18 Claims, 3 Drawing Sheets

(56) References Cited

U.S. PATENT DOCUMENTS

| | | | |
|---|---|---|---|
| 6,014,305 A | 1/2000 | Yu | |
| 6,912,109 B1 | 6/2005 | Ker et al. | |
| 2009/0066403 A1* | 3/2009 | Horsky | G05F 1/571 327/398 |
| 2012/0013321 A1 | 1/2012 | Huang et al. | |
| 2015/0061772 A1* | 3/2015 | Bhattad | G05F 1/56 330/288 |
| 2017/0060166 A1* | 3/2017 | Shukla | G05F 3/267 |

FOREIGN PATENT DOCUMENTS

| | | |
|---|---|---|
| CN | 105045329 A | 11/2015 |
| DE | 102011016127 A1 | 10/2012 |

\* cited by examiner

COMPENSATION CIRCUIT

FIELD OF THE INVENTION

This invention relates to a compensation circuit configured to reduce a disturbance of a reference signal in response to a transient perturbation of a supply voltage, to an integrated circuit comprising the compensation circuit and to an automotive vehicle comprising the integrated circuit.

BACKGROUND OF THE INVENTION

Integrated circuits may perform analogue and digital functions according to required specifications. Such integrated circuits are supplied by a supply voltage generated by a power supply source. This power supply source may be external to the integrated circuit. However, this external power supply source may not be stable enough for supplying the integrated circuits because the external power supply source may supply many circuits with different voltage and current requirements.

For example, in automotive applications, the power supply source is a battery of a vehicle which supplies all integrated circuits in the vehicle.

To this purpose, reference circuits and linear regulators which generate stable reference signals, are typically used to supply internal integrated circuit functions.

Said reference circuits are supplied by the power supply source, thereby any transient perturbations, especially relatively large and fast transient perturbations of the supply voltage, may reflect in a corresponding disturbance of the reference signal over time. Low power reference circuits are typically designed to withstand slow changes of the supply voltage, but not to withstand said relatively fast transient perturbations. If said fast and large transient perturbations are greater than 10 Volt per microsecond or faster, with more than 10 volt peak to peak, the reference signal may be disadvantageously affected, causing malfunctions of the integrated circuit or undesired resetting thereof.

Such fast transient perturbations, known in the art as electrical fast transients (EFT), may be caused by electromagnetic interferences (EMIs), electrostatic discharge (ESD) signals, International Organization for Standardization (ISO) pulses, or the like.

In order to prevent said malfunctions or resets, external capacitors or transient voltage suppressors (TVSs) are used in parallel to the external power supply source to suppress these electrical fast transients. However, external capacitors or TVSs are large and expensive discrete components. Thereby there is a need for a solution that while efficiently suppresses EFTs in integrated circuits is cheaper and smaller than external capacitors or TVSs.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale. In the Figures, elements, which correspond to elements already described, may have the same reference numerals.

DETAILED DESCRIPTION OF THE PREFERRED EMBODIMENTS

An inventive integrated circuit is described which includes a reference circuit and a compensation circuit both electrically coupled to a voltage source.

The voltage source supplies a supply voltage to the compensation circuit and the reference circuit. The reference circuit is configured to generate a reference signal having constant reference amplitude. The reference circuit includes a first circuit node and a reference output electrically coupled to the first circuit node. The reference output outputs the reference signal.

The reference circuit may be used as a local supply for supplying with the reference signal internal circuitry of the integrated circuit.

The compensation circuit includes a transient converter and an adder electrically coupled to the transient converter.

The transient converter converts a first transient perturbation of the supply voltage into a first compensation electrical signal proportional to said first transient perturbation.

The adder adds the first compensation electrical signal to an electrical signal at the first circuit node. The adder is configured to add the first compensation electrical signal with a polarity opposite to a disturbance polarity of a disturbance of the electrical signal generated in response to the first transient perturbation.

The compensation circuit reduces a disturbance of the electrical signal in response to a fast transient perturbation of the supply voltage by adding the compensation electrical signal to the electrical signal at the circuit node with a polarity opposite to that of the disturbance of the electrical signal. Since the circuit node is electrically coupled to the reference output, disturbance of the reference signal caused by the transient perturbation of the supply voltage has been reduced.

The inventive integrated circuit may be used in automotive applications where circuits, particularly reference circuits, need to withstand harsh environmental conditions and be immune to fast transient perturbations of the supply voltage.

Figure 1:
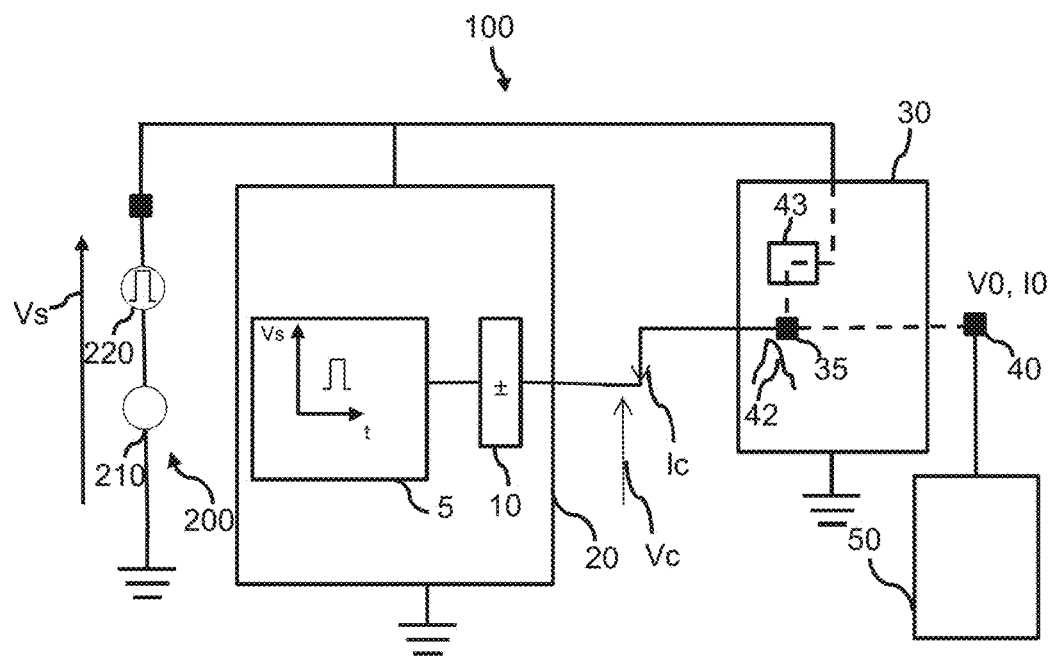
FIG. 1 schematically shows a first example of an integrated circuit according to the invention, FIG. 2 schematically shows a second example of an integrated circuit according to the invention, with positive power supply transient compensation.

FIG. 1 schematically shows an integrated circuit 100 including a compensation circuit 20 and a reference circuit 30. The compensation circuit 20 is configured for coupling to a voltage source 200 and the reference circuit 30. The voltage source 200 is configured for supplying a supply voltage Vs to the compensation circuit 20 and the reference circuit 30.

The voltage source 200 is a Direct Current (DC) voltage source 210 which is configured to supply a constant supply voltage. However, the constant supply voltage may be perturbed in time by positive or negative transient voltage perturbations, for example by fast electrical transients (EFTs), or electrostatic discharge (ESD) transients. The positive or negative transient voltage perturbations are schematically modelled by a transient voltage source 220 arranged in series to the DC voltage source 210. The transient voltage source 220 generates said positive or negative transient voltage perturbations.

The reference circuit 30 is configured to generate a reference signal having constant reference amplitude. For example, the reference signal may be a reference voltage signal with constant amplitude V0 or a reference current signal with constant amplitude I0. The reference signal can be a reference voltage or current signal with better accuracy than the supply voltage Vs. The reference signal can be used to bias circuit 50 of integrated circuit 100. For example, the reference signal may be compensated in temperature such that the reference signal remains substantially constant over a predetermined range of specified temperature values. The reference signal may be compensated also against slow changes of the supply voltage Vs such that the reference signal remains constant over a predetermined range of specified supply voltage values.

The reference circuit 30 includes a first circuit node 35 and a reference output 40 electrically coupled to the first circuit node 35 for outputting the reference signal.

The compensation circuit 20 includes a transient converter 5 for converting a transient perturbation of the supply voltage Vs into a first compensation electrical signal proportional to said transient perturbation.

In another embodiment, the transient converter 5 may be configured to convert positive transient perturbations relative to the constant supply voltage Vs.

The first compensation electrical signal can be proportional to either the positive or the negative transient perturbation of the supply voltage Vs.

The transient converter 5 may capacitively couple the voltage source 200, i.e. a positive terminal of the voltage source 200, to ground. Capacitive coupling may occur via capacitive elements, parasitic or integrated into the transient converter 5. The transient converter 5 may thus be activated only in response to transient perturbations of the supply voltage Vs. In fact only transient currents and no DC currents can flow in the transient converter 5. The transient converter 5 may be inactive during normal mode of operation of the integrated circuit 100, i.e. in absence of transient perturbations of the supply voltage Vs.

In absence of transient perturbations of the supply voltage Vs, the compensation circuit 20 may be in a powerless state, i.e. there is no power consumed by the compensation circuit 20.

The compensation circuit 20 further includes adder 10 for adding the first compensation electrical signal to an electrical signal 42 at the first circuit node 35 with a first polarity opposite to a disturbance polarity of a disturbance of the electrical signal 42. The disturbance of the electrical signal 41 is generated in response to the transient perturbation of the supply voltage Vs.

The reference circuit 30 may include electrical circuits 43 and the first circuit node 35 be electrically coupled to the voltage source 200 via said electrical circuits 43.

Said electrical circuits 43 may include parasitic components, for example a parasitic capacitor (not shown in FIG. 1). The first circuit node 35 can be electrically coupled to the voltage source 200 via said parasitic capacitor.

The electrical signal at the first circuit node 35 can be perturbed because of, for example, parasitic capacitive coupling between the supply voltage Vs and the first node circuit 35 via said parasitic capacitor, by transient perturbations of the supply voltage Vs.

Compensation circuit 20 generates a first compensation electrical signal having the same amplitude but opposite polarity of the perturbed electrical signal 42 at the first circuit node 35, such that electrical signal at the first circuit node 35 is much less perturbed by transient perturbations of the supply voltage Vs.

As a consequence, disturbances of the reference signal over time at the reference output 40 are reduced because the first circuit node 35 is electrically coupled to the reference output 40 and the reference signal is generated via circuitry (not shown in FIG. 1) coupled between said circuit node 35 and the reference output 40.

The adder 10 is configured to provide a compensation electrical signal at the first circuit node 35 with the proper polarity. In case of overshoot or undershoot at first circuit node 35, a first compensation electrical signal with opposite polarity to the polarity of the overshoot or undershoot will be added to the electrical signal.

The first compensation electrical signal may be a current signal Ic or voltage signal Vc proportional to the transient perturbation of the supply voltage Vs.

The adder 10 may be configured to add the current Ic or the voltage Vc with positive or negative sign to the first circuit node 35 for compensating disturbances of the electrical signal at the first circuit node 35 over time caused by transient perturbation of the supply voltage Vs.

The electrical signal at the first circuit node 35 can be a current signal or a voltage signal.

In a preferred embodiment, if the electrical signal to be compensated at the first circuit node 35 is a current signal, then the first compensation electrical signal is a compensation current signal Ic. Addition of the first compensation electrical signal Ic is in this case performed in parallel to the current signal flowing through the first circuit node 35.

In an embodiment, the first circuit node 35 may be a relative high impedance node. The current signal flowing through the first circuit node 35 may be a relatively small current.

When the first compensation electrical signal is a compensation voltage signal Vc, the compensation circuit 20 may include additional components not shown in FIG. 1, for example a coupling capacitor via which the compensation voltage signal Vc is coupled to the first circuit node 35. The coupling capacitor may have a capacitance larger than, for example, the equivalent capacitance of the parasitic capacitor coupling the voltage source 200 to the first circuit node 35.

The reference signal generated by the reference circuit 30 has been compensated against transient perturbations of the supply voltage Vs, for example fast electrical transients (EFTs), or electrostatic discharge (ESD) transients, without the use of external capacitor or transient voltage suppressors (TVS) arranged across the voltage source 200.

The compensation circuit 20 can be integrated in the integrated circuit 100 in the same chip using the same process technology, thus abating the costs of manufacturing of the integrated circuit 100 including the compensation circuit 20.

All circuit nodes of the reference circuit 30 which are electrically coupled, in particular circuit nodes which are capacitively coupled, to the voltage source 200, can be compensated with the compensation electrical signal Ic or Vc. The reference signal has been immunized against transient perturbations of the voltage supply Vs. The integrated circuit 100 is more robust and can be used more extensively in harsh environmental conditions where electromagnetic interferences (EMIs) can critically affect the functionality of the integrated circuit 100 as for example in automotive systems.

Figure 2:
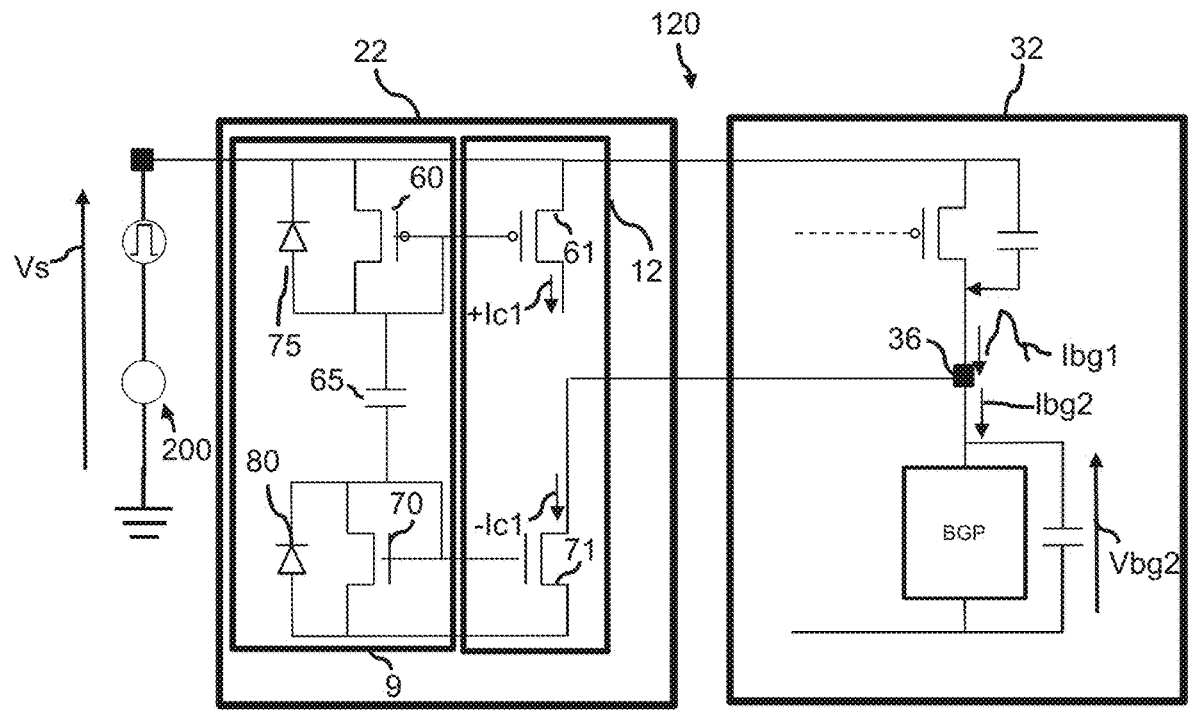

FIG. 2 schematically shows a second example of an integrated circuit 120 according to the invention. The integrated circuit 120 includes a compensation circuit 22 and a reference circuit 32. Compensation circuit 22 may be a practical ultra-low power implementation of a compensation circuit according to an embodiment of the invention.

Compensation circuit 22 includes a positive transient converter 9 configured for generating a compensation current Ic1 proportional to a positive transient perturbation of voltage supply Vs, and adder 12 for adding said compensation current Ic1 to circuit node 36 of the reference circuit 32.

In this example circuit node 36 coincides with the reference output of reference circuit 32. Electrical current Ibg1 flowing through circuit node 36 has a disturbance polarity, as indicated by the overshoot of the electrical current Ibg1.

The adder 12 is configured for adding the compensation current −Ic1 with a first polarity opposite to the disturbance polarity.

The adder 12 may be configured to add the compensation current Ic1 with a second polarity opposite to the first polarity to a second electrical signal at a second circuit node (not shown in FIG. 2) of the reference circuit 32.

The positive transient converter 9 includes a series arrangement of at least a first transistor 60, a first capacitor 65 and a second transistor 70.
Transistor 60 and 70 are metal Oxide Semiconductor Field Effect transistors (MOSFETs).

Each transistor has respective first terminal, second terminal and third terminal wherein the second terminal and the third terminal form a main current path for each transistor.

In the example shown in FIG. 2, transistor 60 is a PMOS transistor and transistor 70 is a NMOS transistor. For MOSFETs, the first terminal is the gate, the second terminal is the source, and the third terminal is the drain of each respective MOS transistor.

The respective drain of PMOS transistor 60 and NMOS transistor 70 is electrically connected to the respective gate. In this configuration, an instantaneous voltage across the PMOS transistor 60 or NMOS transistor 70 equal or larger than the threshold voltage of the respective transistor, activates the main current path through the source and the drain.

Further, the drain of PMOS transistor 60 is electrically coupled to a first terminal of the first capacitor 65 and drain of the NMOS transistor 70 is electrically coupled to a second terminal of the first capacitor 65.

The source of the PMOS 60 is electrically coupled to a positive terminal of the voltage source 200 and drain of NMOS 70 is electrically coupled to a reference potential, for example a terminal of a further voltage source generating a negative supply voltage or the ground.

Diode 75 is the body diode of PMOS transistor 60 and diode 80 is the body diode of NMOS transistor 70. Diodes 75 and 80 are used to discharge capacitor 65 after the fast transient of the voltage supply Vs has occurred.

Reference circuit 32 may be a bandgap voltage based reference circuit generating a reference voltage value between 1.2 Volts and 1.3 Volts which is substantially independent of temperature. However, the reference circuit 32 may be of any other type suitable for the specific implementation.

Operation of the integrated circuit 120 is explained with reference to FIG. 3 which shows the simulated signal diagrams versus time for the integrated circuit 120.

When a ISO pulse voltage 300, i.e. according to International Organization for Standardization (ISO) is supplying the reference circuit 32, and when no compensation circuit 22 is used, the reference voltage Vbg1 at the circuit node 36 can overshoot during the rising time and undershoot during the falling time of the pulse voltage 300 to a relatively large extent. The ISO pulse voltage 300 of the example shown in FIG. 3 rises from 12 Volts to 40 Volts or more in less than 10 microseconds, keeps a constant final voltage value during a time width tw of 100 microseconds, and falls to 12 Volts in less than 10 microseconds.

Compensation current Ic1 can be generated by the transient converter 9 in response to positive transient perturbation of the supply voltage Vs, i.e. during the rising time of the ISO pulse voltage 300.

During the rising time of the pulse voltage 300, a transient current flowing through the capacitor 65 proportional to the positive transient perturbation of the supply voltage Vs is generated.

$$Ic1 \approx C_{65} \frac{dVs}{dt} \quad (1)$$

The transient compensation current Ic1 is mirrored via current mirror 70 and 71 with a first polarity (−Ic1) and via current mirror 60 and 61 with a second polarity (+Ic1) opposite to the first polarity.

The compensation current −Ic1 is effectively subtracted from the current Ibg1 flowing into circuit node 36, such that the remaining signal current Ibg2 is compensated and disturbance reduced during the positive transient perturbation of the supply voltage Vs (rising of the pulse voltage 300).

Compensation current +Ic1 may be used in another circuit node (not shown in FIG. 2) of reference circuit 32.

During the falling time of the pulse voltage 300, the transient converter 9 does not generate any current. For negative transient perturbation of the supply voltage Vs PMOS transistor 60 and NMOS transistor 70 will be not conducting any instantaneous current because there cannot be any capacitive coupling of the supply voltage Vs via the drain-to-source parasitic capacitor which drives the PMOS transistor 60 and NMOS transistor 70 into transient conduction mode.

Figure 3:
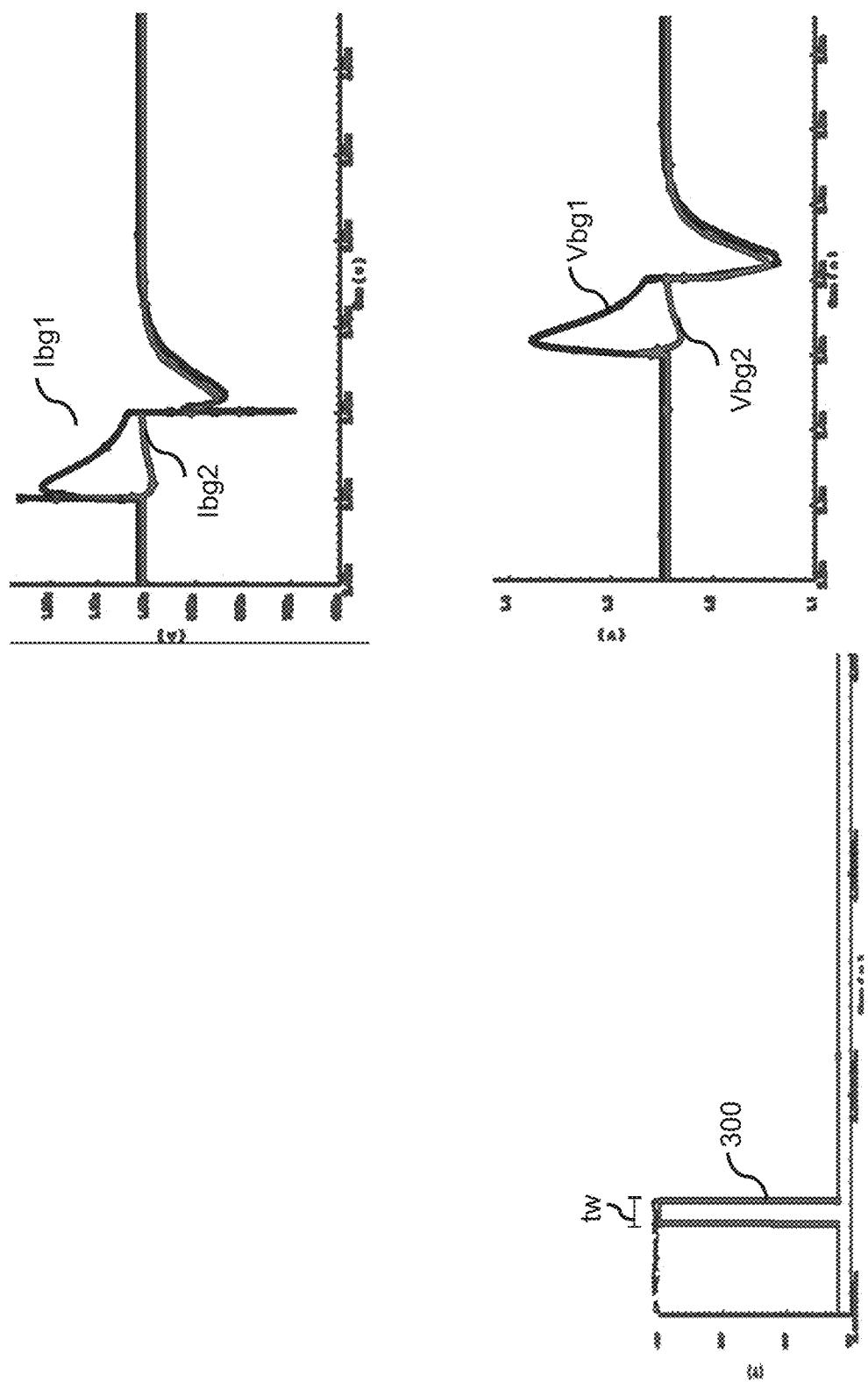
FIG. 3 shows simulated signal diagrams versus time for the example of the integrated circuit shown in FIG. 2, FIG. 4 schematically shows a third example of an integrated circuit according to the invention with both positive and negative power supply transient compensation.

Since compensation circuit 22 is configured to operate only for positive transient perturbation of the supply voltage Vs, no compensation of the perturbed electrical current Ibg1 is visible in FIG. 3 for such negative transient perturbations of the supply voltage Vs.

As a consequence, the disturbance of the bandgap voltage Vbg2 over time due to the positive transient perturbation of the supply voltage Vs is substantially reduced. The bandgap voltage Vbg2 has been made more immune to positive transient perturbations of the supply voltage Vs, in particular fast positive transient perturbations in the order of, for example, 1 Volt per microsecond or faster.

The transient converter may be configured to detect transient perturbations of the supply voltage Vs of the same order, i.e. for example transient perturbations faster than 1 Volt per microsecond.

Figure 4:
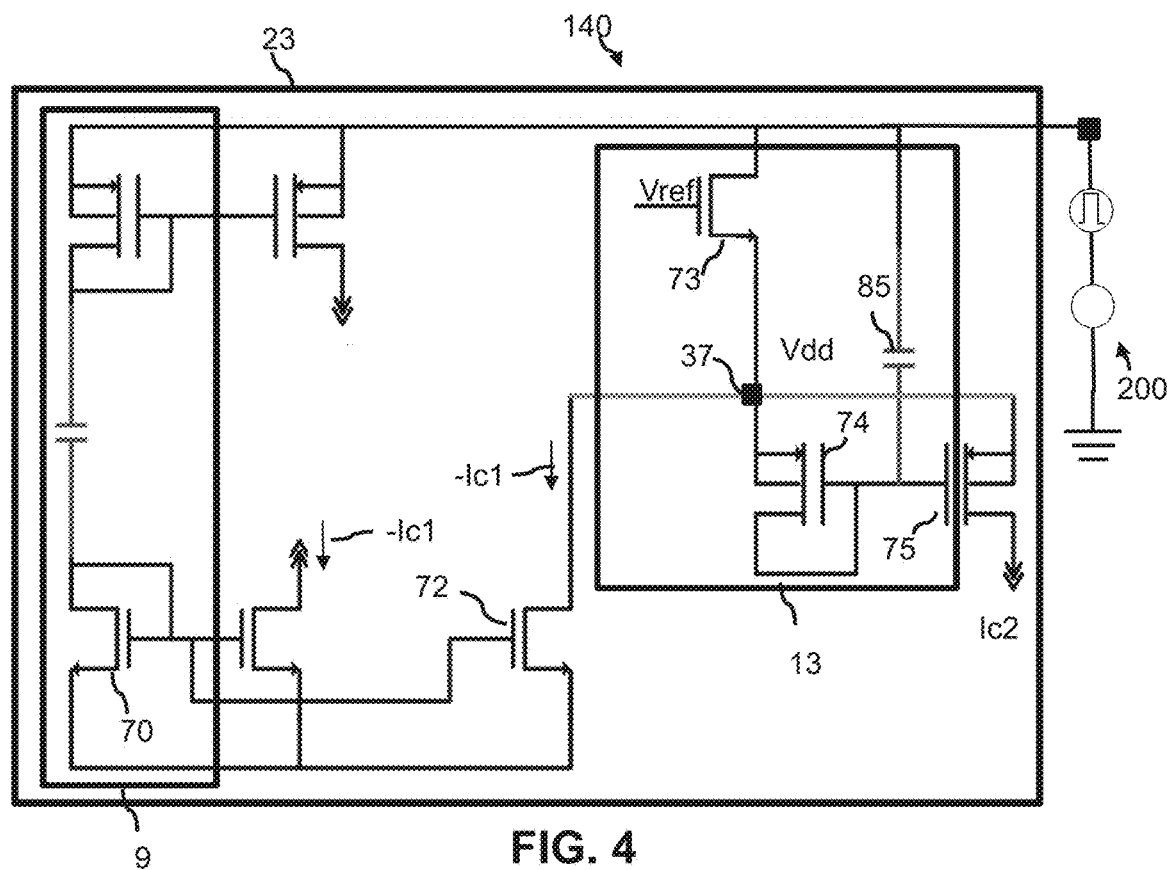

FIG. 4 schematically shows a third example of an integrated circuit 140. Integrated circuit 140 includes a compensation circuit 23. Compensation circuit 23 includes the positive transient converter 9 shown in FIG. 2 and a further transient converter 13.

Transient converter 9 of compensation circuit 23 generates compensation current −Ic1 proportional to a positive transient perturbation of the supply voltage Vs.

Further transient converter 13 is configured to generate a second compensation current Ic2 proportional to a negative transient perturbation of the supply voltage Vs.

Compensation circuit 23 further differs from compensation circuit 22 shown in FIG. 2 in that compensation current −Id 1 is further copied by current mirror formed by NMOS transistors 70 and 72 and injected into circuit node 37. Adder may be configured to output more than one compensation electrical currents having further compensation amplitudes. These further compensation amplitudes may be proportional to the amplitude of compensation current Ic. This can be achieved by for example adjusting the mirror ratios (are of transistors 70 and 72) in the adder.

Further, transient converter 13 includes a second capacitor 85, a series arrangement of a NMOS transistor 73 and PMOS transistor 74. Gate terminal of the NMOS transistor 73 is electrically coupled to a positive terminal of a reference voltage source (Vref). A local power supply voltage Vdd is generated at circuit node 37 by the reference voltage source Vref and a matched gate-source voltage of NMOS transistor 73. The drain terminal of NMOS transistor 73 is electrically coupled to a positive terminal of the voltage source 200 and a first terminal of the second capacitor 85. Source terminal of PMOS transistor 74 is electrically coupled to source terminal of NMOS transistor 73, i.e. to the local power supply voltage Vdd. Drain terminal of the PMOS transistor 74 is electrically coupled to the gate terminal of the PMOS transistor 74 and to a second terminal of the second capacitor 85.

As schematically shown in FIG. 4, the local power supply voltage Vdd is generated by the NMOS transistor 73 and the reference voltage source Vref. However, the local supply voltage Vdd can be generated in any manner suitable for the specific implementation. For example, the reference voltage Vref+Vgs may be generated by a local voltage source designed to provide a constant reference voltage for generating a constant voltage Vdd. During normal operation, i.e. when in absence of transient perturbations on the supply voltage Vs, no current is flowing through NMOS transistor 73.

The reference voltage Vref, thus also local supply voltage Vdd, and the second capacitor 85 ensure that current mirror formed by PMOS transistors 74 and 75 is properly biased when the supply voltage Vs is perturbed with a negative transient perturbation.

For negative transient perturbations of the supply voltage Vs, second capacitor 85 couples the positive terminal of the voltage source 200 to the gate terminals of PMOS transistors 74 and 75 such that a source-gate voltage of PMOS transistors 74 and 75 is higher than the threshold voltage of the respective PMOS transistors 74 and 75 and PMOS transistors 74 and 75 can conduct transient electrical current. A current Ic2 proportional to the negative transient perturbation of the supply voltage Vs can be generated.

$$Ic2 \approx -C_{85}\frac{dVs}{dt} \quad (2)$$

During negative transient perturbations of the supply voltage Vs, electrical current −Ic1 is zero. Transient converter 9 has no impact on the functionality of negative transient converter 13.

For positive transient perturbations of the supply voltage Vs, Ic2 is zero because PMOS transistors 74 and 75 cannot be biased into transient conduction mode.

Connection of drain of NMOS transistor 72 to circuit node 37 is only for reliability purpose of NMOS transistor 73, to prevent that during positive transient perturbations of the supply voltage Vs NMOS transistor 73 is damaged.

By integrating in a single integrated circuit 140 a positive transient converter 9 and a negative transient converter 13, electrical signals at different internal circuit nodes of integrated circuit 140 (not shown in FIG. 4) can be stabilized against any positive or negative transient perturbation of the supply voltage Vs.

Since, transient converters 9 and 13 do not consume any electrical current during normal operation of the integrated circuit 140, i.e. in absence of perturbations of the supply voltage Vs, those circuits can be used in low power consumption circuits without having impact on the total power consumption of the circuits.

Converter 9 works only for positive transient perturbations and converter 13 works only for negative transient perturbations, thus currents −Ic1 or Ic2 can be injected into the same circuit node for stabilizing the corresponding electrical signal preventing that both transient converters 9 and 13 load the circuit node at the same time. Further, since compensation circuit 23 is normally off, the circuit nodes to be compensated are not loaded, thereby the integrated circuit functionality is not affected during normal operation.

Compensation circuits 22, 23 can be fully integrated with the integrated circuits 120, 140, thereby the provided solution can be more compact and less expensive than known solutions using external components, arranged, for example, across the voltage source 200 to suppress electrical fast transients (EFTs) thereof.

Compensation circuits 22, 23 may be configured to reduce a level of the disturbance of the reference signal relative to the constant reference amplitude to less than 5% the constant reference amplitude.

Figure 5:
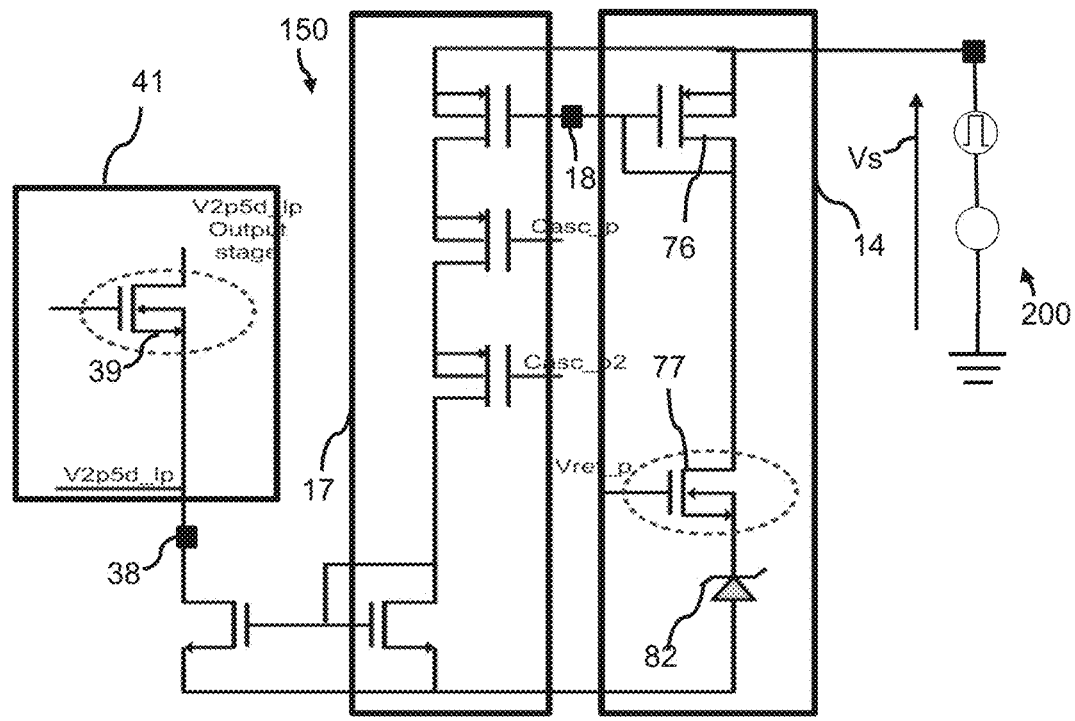
FIG. 5 shows a fourth example of an integrated circuit according to the invention with positive transient power supply compensation.

FIG. 5 shows a fourth example of an integrated circuit 150 according to the invention.

Integrated circuit 150 includes a transient converter 14 for converting positive transient perturbations of the supply voltage Vs into a compensation electrical signal proportional to said positive variation, adder 17 for adding the compensation electrical signal and a reference circuit 41.

The transient converter 14 includes a series arrangement of at least a PMOS transistor 76, a NMOS transistor 77 and a diode 82. Diode 82 is a zener diode. The drain of PMOS transistor 76 is electrically connected to the gate of PMOS transistor 76 and to the drain of NMOS transistor 77. The gate of NMOS transistor 77 is biased to a reference voltage Vref_p and the drain of the NMOS transistor 77 is electrically coupled to the cathode of the zener diode 82. The anode of the zener diode 82 is electrically coupled to a reference potential, for example a terminal of a further voltage source generating a negative supply voltage, or the ground.

Zener diode 82 is used to stop DC current flowing through the series arrangement and at the same time to clamp voltage at the source of NMOS transistor 77 to a specified value when the supply voltage variations are relatively large, for example during an electrostatic discharge (ESD) pulse.

Adder 17 includes a current mirror having a mirror input 18 electrically coupled to gate of PMOS transistor 76 and a mirror output. The reference circuit 41 is a voltage reference of which only output transistor 39 is shown. Output transistor 39 has a transistor output terminal corresponding to reference output 38. The mirror output is electrically connected to the reference output 38.

In this example, positive transient of the supply voltage Vs is detected through capacitive parasitic coupling via the parasitic drain to source capacitor of NMOS transistor 77.

Further, transient converter 14 and reference circuit 41 are designed such that NMOS transistor 77 and the output transistor 39 are formed close to each other in a same layout area of the integrated circuit 150 for geometrically matching NMOS transistor 77 with the output transistor 39. This increases accuracy of the compensation versus process parameter variations occurring during manufacturing of the integrated circuit 150.

Integrated circuits 100, 120, 140, 150 may be used in automotive systems. For example, an automotive vehicle may include an electronic device for controlling one or more parts of the automotive vehicle. The electronic device may include any of the integrated circuits 100, 120, 140, 150 shown through the Figures. Since automotive vehicles are manufactured to run safe also in harsh environment, requirements on immunity to supply variations of electronic devices used for automotive systems, caused by, for example, electromagnetic interferences (EMI) in the battery cables, or sudden connection or disconnection of the battery, are particularly stringent. Electronic devices using the integrated circuits 100, 120, 140, 150 are more immune to such voltage supply transient perturbations and cheaper than known counterparts using external compensation components, because respective compensation circuits can be fully integrated in the same chip with the reference circuits.

According to an example of the present application, a compensation circuit configured for coupling to a voltage source and a reference circuit is provided. The compensation circuit comprise a transient converter and an adder. The transient converter is provided for converting a first transient perturbation of a supply voltage into a first compensation electrical signal proportional to said first transient perturbation. The voltage source is configured for supplying the supply voltage to the compensation circuit and the reference circuit, and the reference circuit is configured to generate a reference signal having a constant reference amplitude. The reference circuit comprises a first circuit node and a reference output electrically coupled to the first circuit node for outputting the reference signal. The adder is coupled to the transient converter for adding the first compensation electrical signal to an electrical signal at the first circuit node, with a first polarity opposite to a disturbance polarity of a disturbance of the electrical signal in response to the first transient perturbation.

According to an example of the present application, the first circuit node is the reference output.

According to an example of the present application, the transient converter is configured to convert positive transient perturbations relative to the supply voltage, or negative transient perturbations relative to the supply voltage.

According to an example of the present application, the transient converter is arranged to capacitively couple the voltage source to the ground and configured to be activated in response to the first transient perturbation of the supply voltage.

According to an example of the present application, the compensation is configured to be in a powerless state in absence of the first transient perturbation of the supply voltage.

According to an example of the present application, the first compensation electrical signal is a current signal.

According to an example of the present application, the adder is configured for adding the first compensation electrical signal with a second polarity opposite to the first polarity to a second electrical signal at a second circuit node of the reference circuit.

According to an example of the present application, the compensation comprises a further transient converter, which is configured to generate a second compensation electrical signal proportional to a second transient perturbation of the supply voltage. The first transient perturbation has a first perturbation polarity and the second transient perturbation has a second perturbation polarity opposite to the first perturbation polarity.

According to an example of the present application, the first compensation electrical signal has compensation amplitude. The adder is configured to output one or more further compensation electrical signals having corresponding one or more further compensation amplitudes proportional to the compensation amplitude for adding the one or more further compensation electrical signals to corresponding one or more further circuit nodes of the reference circuit.

According to an example of the present application, the compensation circuit is configured to reduce a level of the disturbance of the reference signal relative to the constant reference amplitude to less than 5% the constant reference amplitude.

According to an example of the present application, the transient converter is configured for detecting transient perturbations of the supply voltage faster than 1 Volt per microsecond.

According to an example of the present application, the transient converter comprises a series arrangement of at least a first transistor, a first capacitor and a second transistor. Each transistor has a respective first terminal, second terminal and third terminal that form a main current path for each transistor. The third terminal of each transistor is electrically connected to the first terminal. The third terminal of the first transistor is electrically coupled to a first terminal of the first capacitor. The third terminal of the second transistor is electrically coupled to a second terminal of the first capacitor. The second terminal of the first transistor is electrically coupled to a positive terminal of the voltage source. The second terminal of the second transistor is electrically coupled to a reference potential.

According to an example of the present application, the adder comprises at least a third transistor arranged in parallel to the first transistor for generating a compensation electrical current having the first polarity.

According to an example of the present application, the adder comprises at least a fourth transistor arranged in parallel to the second transistor for generating a compensation electrical current having a second polarity opposite to the first polarity.

According to an example of the present application, the transient converter comprises a series arrangement of at least a fifth transistor, a sixth transistor and a diode. The fifth and the sixth transistors have each respective first terminal, second terminal and third terminal forming a main current path of the respective transistor. The diode has an anode and a cathode. The first terminal of the fifth transistor is electrically connected to the third terminal of the fifth transistor and to the third terminal of the sixth transistor. The first terminal of the sixth transistor is electrically coupled to a positive terminal of a reference voltage source and the second terminal of the sixth transistor is electrically coupled to the cathode. The anode is electrically coupled to a reference potential.

According to an example of the present application, the adder comprises a current mirror having a mirror input electrically coupled to the first terminal of the fifth transistor and a mirror output. The reference circuit comprises an output transistor having a transistor output terminal corresponding to the reference output. The mirror output is electrically coupled to the transistor output terminal.

According to an example of the present application, the sixth transistor and the output transistor are formed close to each other in a same layout area for geometrically and electrically matching the sixth transistor with the output transistor.

According to an example of the present application, the further transient converter comprises a second capacitor and a series arrangement of a seventh transistor and eighth transistor. The seventh and eighth transistors have each respective first terminal, second terminal and third terminal forming a main current path of the respective transistor. The first terminal of the seventh transistor is electrically coupled to a positive terminal of a reference voltage source. The second terminal of the seventh transistor is electrically coupled to a positive terminal of the voltage source and a first terminal of the second capacitor. The third terminal of the seventh transistor is electrically coupled to the second terminal of the eight transistor. The first terminal of the eighth transistor is electrically coupled to the second terminal of the eighth transistor and to a second terminal of the second capacitor.

According to an example of the present application, an integrated circuit is provided comprising a reference circuit and a compensation circuit. The reference circuit is configured to generate a reference signal having a constant reference amplitude. The reference circuit comprises a first circuit node and a reference output electrically coupled to the first circuit node for outputting the reference signal. The compensation circuit is configured for coupling to a voltage source and the reference circuit. The voltage source is configured for supplying a supply voltage to the compensation circuit and the reference circuit. The compensation circuit further comprises a transient converter and an adder. The transient converter is provided for converting a first transient perturbation of the supply voltage into a first compensation electrical signal proportional to said first transient perturbation. The adder is coupled to the transient converter for adding the first compensation electrical signal to an electrical signal at the first circuit node, with a first polarity opposite to a disturbance polarity of a disturbance of the electrical signal in response to the first transient perturbation.

According to an example of the present application, an automotive vehicle comprising an electronic device for controlling one or more parts of the automotive vehicle is provided. The electronic device comprises an integrated circuit comprising a reference circuit and a compensation circuit. The reference circuit is configured to generate a reference signal having a constant reference amplitude. The reference circuit comprises a first circuit node and a reference output electrically coupled to the first circuit node for outputting the reference signal. The compensation circuit configured for coupling to a voltage source and the reference circuit. The voltage source is configured for supplying a supply voltage to the compensation circuit and the reference circuit. The compensation circuit further comprises a transient converter and an adder. The transient converter is provided for converting a first transient perturbation of the supply voltage into a first compensation electrical signal proportional to said first transient perturbation. The adder is coupled to the transient converter for adding the first compensation electrical signal to an electrical signal at the first circuit node, with a first polarity opposite to a disturbance polarity of a disturbance of the electrical signal in response to the first transient perturbation.

Through the Figures, Metal-Oxide-Semiconductors Field Effect Transistors (MOSFETs) have been shown. However, other type of transistors may be used: for example Bipolar Junction Tansistors (BJTs), Metal-Semiconductor Field Effect transistors (MESFETs), Junction-Field Effect Transistors (J-FETs), Insulated-gate Bipolar Junction Transistors (IGBJTs), Hybrid Bipolar Junction Transistors (HBJT), or the like.

It is to be understood that the circuits depicted herein are merely exemplary, and that in fact many other circuits can be implemented which achieve the same functionality.

For example, with reference to FIG. 1, a current mirror formed by transistors 70 and 71 has been shown. Many other types of mirror configurations known in the art are possible, for example, cascode current mirror, Widlar current mirror, Wilson current mirror. Further, reference circuits shown may of any type, bandgap based references, voltage regulators, DC-DC converters or the like.

In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably electrically coupled," to each other to achieve the desired functionality.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Furthermore, the devices may be physically distributed over a number of apparatuses, while functionally operating as a single device. Also, devices functionally forming separate devices may be integrated in a single physical device. Also, the units and circuits may be suitably combined in one or more semiconductor devices. However, other modifications, variations and alternatives are also possible. The specifications and drawings are, accordingly, to be regarded in an illustrative rather than in a restrictive sense.

The claims provide a compensation circuit configured for coupling to a voltage source and a reference circuit, The compensation circuit comprises a transient converter for converting a first transient perturbation of a supply voltage into a first compensation electrical signal proportional to said first transient perturbation. The voltage source is configured for supplying the supply voltage to the compensation circuit and the reference circuit. The reference circuit is configured to generate a reference signal having a constant reference amplitude. The reference circuit comprises a first circuit node and a reference output electrically coupled to the first circuit node for outputting the reference signal.

The compensation circuit comprises an adder coupled to the transient converter for adding the first compensation electrical signal to an electrical signal at the first circuit node, with a first polarity opposite to a disturbance polarity of a disturbance of the electrical signal in response to the first transient perturbation.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A compensation circuit configured for coupling to a voltage source and a reference circuit, the compensation circuit comprising:
   a transient converter for converting a first transient perturbation of a supply voltage into a first compensation electrical signal proportional to said first transient perturbation, the voltage source configured for supplying the supply voltage to the compensation circuit and the reference circuit, and the reference circuit configured to generate a reference signal having a constant reference amplitude, the reference circuit comprising a first circuit node and a reference output electrically coupled to the first circuit node for outputting the reference signal; and
   an adder coupled to the transient converter for adding the first compensation electrical signal to an electrical signal at the first circuit node, the first compensation electrical signal having a first polarity opposite to a disturbance polarity of a disturbance of the electrical signal, the disturbance of the electrical signal in response to the first transient perturbation;
   wherein the compensation circuit is further configured to be in a powerless state in absence of the first transient perturbation of the supply voltage.

2. The compensation circuit according to claim 1, wherein the first circuit node is the reference output.

3. The compensation circuit according to claim 1, wherein the transient converter is configured to convert positive transient perturbations relative to the supply voltage, or negative transient perturbations relative to the supply voltage.

4. The compensation circuit according to claim 1, wherein the transient converter is arranged to capacitively couple the voltage source to the ground and configured to be activated in response to the first transient perturbation of the supply voltage.

5. The compensation circuit according to claim 1, wherein the first compensation electrical signal is a current signal.

6. The compensation circuit according to claim 1, wherein the adder is configured for adding the first compensation electrical signal with a second polarity opposite to the first polarity to a second electrical signal at a second circuit node of the reference circuit.

7. The compensation circuit according to claim 1, comprising a further transient converter configured to generate a second compensation electrical signal proportional to a second transient perturbation of the supply voltage,
   wherein the first transient perturbation has a first perturbation polarity and the second transient perturbation has a second perturbation polarity opposite to the first perturbation polarity.

8. The compensation circuit according to claim 7, wherein the further transient converter comprises a second capacitor and a series arrangement of a seventh transistor and eighth transistor,
   wherein the seventh and eighth transistors have each respective first terminal, second terminal and third terminal forming a main current path of the respective transistor,
   wherein the first terminal of the seventh transistor is electrically coupled to a positive terminal of a reference voltage source,
   wherein the second terminal of the seventh transistor is electrically coupled to a positive terminal of the voltage source and a first terminal of the second capacitor,
   wherein the third terminal of the seventh transistor is electrically coupled to the second terminal of the eight transistor,
   wherein the first terminal of the eighth transistor is electrically coupled to the second terminal of the eighth transistor and to a second terminal of the second capacitor.

9. The compensation circuit according to claim 1, wherein the first compensation electrical signal has compensation amplitude, and the adder is configured to output one or more further compensation electrical signals having corresponding one or more further compensation amplitudes proportional to the compensation amplitude for adding the one or more further compensation electrical signals to corresponding one or more further circuit nodes of the reference circuit.

10. The compensation circuit according to claim 1, wherein the transient converter comprises:
    a series arrangement of at least a first transistor, a first capacitor and a second transistor,
       wherein each transistor has a respective first terminal, second terminal and third terminal that form a main current path for each transistor,
       wherein the third terminal of each transistor is electrically connected to the first terminal,
       wherein the third terminal of the first transistor is electrically coupled to a first terminal of the first capacitor,
       wherein the third terminal of the second transistor is electrically coupled to a second terminal of the first capacitor,
       wherein the second terminal of the first transistor is electrically coupled to a positive terminal of the voltage source, and
       wherein the second terminal of the second transistor is electrically coupled to a reference potential.

11. The compensation circuit according to claim 10, wherein the adder comprises at least one of at least a third transistor arranged in parallel to the first transistor for generating a compensation electrical current having the first polarity and at least a fourth transistor arranged in parallel to the second transistor for generating a compensation electrical current having a second polarity opposite to the first polarity.

12. The compensation circuit according to claim 1, wherein the transient converter comprises a series arrangement of at least a fifth transistor, a sixth transistor and a diode,
   wherein the fifth and the sixth transistors have each respective first terminal, second terminal and third terminal forming a main current path of the respective transistor,
   wherein the diode has an anode and a cathode,
   wherein the first terminal of the fifth transistor is electrically connected to the third terminal of the fifth transistor and to the third terminal of the sixth transistor,
   wherein the first terminal of the sixth transistor is electrically coupled to a positive terminal of a reference voltage source and the second terminal of the sixth transistor is electrically coupled to the cathode, and
   wherein the anode is electrically coupled to a reference potential.

13. The compensation circuit according to claim 12, wherein the adder comprises a current mirror having a mirror input electrically coupled to the first terminal of the fifth transistor and a mirror output,
   wherein the reference circuit comprises an output transistor having a transistor output terminal corresponding to the reference output, wherein the mirror output is electrically coupled to the transistor output terminal.

14. An integrated circuit comprising:
   a reference circuit configured to generate a reference signal having a constant reference amplitude, wherein the reference circuit comprises a first circuit node and a reference output electrically coupled to the first circuit node for outputting the reference signal; and
   a compensation circuit configured for coupling to a voltage source and the reference circuit; wherein the compensation circuit includes:
      a transient converter for converting a first transient perturbation of a supple voltage into a first compensation electrical signal proportional to said first transient perturbation; and
      an adder coupled to the transient converter for adding the first compensation electrical signal to an electrical signal at the first circuit node,
   wherein the voltage source configured for supplying the supply voltage to the compensation circuit and the reference circuit, and wherein the compensation circuit is further configured to be in a powerless state in absence of the first transient perturbation of the supply voltage.

15. The compensation circuit according to claim 14, wherein the first circuit node is the reference output.

16. A compensation circuit according to claim 14, wherein the transient converter is configured to convert positive transient perturbations relative to the supply voltage, or negative transient perturbations relative to the supply voltage.

17. The compensation circuit according to claim 14, wherein the transient converter is arranged to capacitively couple the voltage source to the ground and configured to be activated in response to the first transient perturbation of the supply voltage.

18. The compensation circuit according to claim 14, wherein the first compensation electrical signal is a current signal.

* * * * *